United States Patent
Renau et al.

(10) Patent No.: US 7,579,605 B2
(45) Date of Patent: Aug. 25, 2009

(54) MULTI-PURPOSE ELECTROSTATIC LENS FOR AN ION IMPLANTER SYSTEM

(75) Inventors: Anthony Renau, W. Newbury, MA (US); James S. Buff, Brookline, NH (US); Svetlana B. Radovanov, Marblehead, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 494 days.

(21) Appl. No.: 11/536,872

(22) Filed: Sep. 29, 2006

(65) Prior Publication Data

US 2008/0078951 A1    Apr. 3, 2008

(51) Int. Cl.
*H01J 37/141* (2006.01)
*H01J 37/317* (2006.01)

(52) U.S. Cl. .............................. 250/492.21; 250/396 R

(58) Field of Classification Search ............ 250/492.21, 250/396 R
See application file for complete search history.

(56) References Cited

U.S. PATENT DOCUMENTS

| 3,295,001 | A |   | 12/1966 | Burdick et al. |
|---|---|---|---|---|
| 5,680,254 | A | * | 10/1997 | Ueda et al. .................. 359/652 |
| 6,757,051 | B2 | * | 6/2004 | Takahashi et al. ............. 355/67 |
| 6,934,009 | B2 | * | 8/2005 | Terashi ........................ 355/67 |
| 2002/0196629 | A1 | * | 12/2002 | Terashi ....................... 362/331 |
| 2006/0098298 | A1 | * | 5/2006 | Kato et al. .................. 359/649 |
| 2006/0113493 | A1 |   | 6/2006 | Kabasawa et al. |
| 2007/0160096 | A1 | * | 7/2007 | Tanaka ........................ 372/33 |
| 2008/0174864 | A1 | * | 7/2008 | Tanaka ....................... 359/432 |

FOREIGN PATENT DOCUMENTS

WO     20060014633 A    2/2006

* cited by examiner

*Primary Examiner*—Nikita Wells
*Assistant Examiner*—Johnnie L Smith

(57) ABSTRACT

Multi-purpose electrostatic lens for an ion implanter. The electrostatic lens allows an ion implanter to scan, accelerate, decelerate, expand, compress, focus and parallelize an ion beam. This capability enables the ion implanter to function as either a high precision medium-current ion implanter or as a high-current ion implanter.

32 Claims, 5 Drawing Sheets

MULTI-PURPOSE ELECTROSTATIC LENS FOR AN ION IMPLANTER SYSTEM

TECHNICAL FIELD

This disclosure relates generally to ion implanter systems, and more specifically to an electrostatic lens that allows an ion implanter system to scan, decelerate, accelerate, expand, parallelize or focus an ion beam.

BACKGROUND

Modern semiconductor manufacturing generally relies on ion implanter systems for doping or otherwise modifying silicon and other types of semiconductor wafers. A typical ion implanter system performs the doping by generating an ion beam and steering it into a substrate so that the ions come to rest beneath the surface. As a part of this process it is often convenient to arrange that the ions travel through most of the implanter's optical system at the energy at which they were extracted from a source, but use electric fields near the end of the beamline to accelerate or decelerate the ions to the required implantation energy. Such an arrangement improves transmission efficiency.

High-current ion implanter systems are one type of implanter system that is widely used in semiconductor manufacturing. Such implanter systems typically produce currents up to 25 milliamperes (mA). An important class of high current implanter systems uses an expanded beam, also known as a ribbon beam. In high-dose applications, a higher beam current results in a faster implantation, which means a greater output of wafers per hour. Ion implanter system manufacturers have invested a great deal of effort in maximizing beam current, especially at the lowest energies, where Child's law limits the flux of ions that can be extracted from an ion source. Despite this effort, low-energy, high-current ion implanter systems generally operate with less precision than implanters known as medium current machines.

Medium-current ion implanter systems produce an ion beam having an intensity in the range of one microampere (µA) to about five mA, at energies between 5 kiloelectron volt (keV) and 900 keV. Generally, medium current implanter systems operate by scanning a spot beam across a wafer. In contrast to low-energy high-current ion implanter systems, medium-current ion implanters can operate with higher precision because beam scanning is used in place of a ribbon beam causing the beam to scan back and forth very quickly across the wafer. However, when the ion beam energy is decreased, the spot size typically increases, making it harder to use a medium-current ion implanter for scanning.

In order to meet the increasing demands of semiconductor manufacturers to place more components on an integrated circuit, it is necessary that future high-current ion implanter systems and medium-current ion implanter systems provide greater capability in controlling the ion beam so that lower energies can be produced. Controlling the ion beam at lower energies will allow ion implanter systems to deposit ions at smaller depths and dimensions below the wafer surface and consequently place more components onto an integrated circuit.

Therefore, in order to meet the increasing demands of semiconductor manufacturers, there is a need for providing a high-current ion implanter system and medium-current ion implanter system that can better control an ion beam. An even better scenario would be to provide a single ion implanter system that can control an ion beam at lower beam energies and simultaneously perform the functionalities of both high-current ion implanter systems and medium-current ion implanter systems.

SUMMARY

In one embodiment, there is an electrostatic lens. In this embodiment, the electrostatic lens comprises an apertured entrance electrode that receives an ion beam. The apertured entrance electrode is configured to receive a first potential. An electrode having a curved surface is configured to receive the ion beam after passing through the apertured entrance electrode. The curved surface electrode is configured to receive a second potential. A biconvex-shaped focusing electrode is configured to receive the ion beam after passing from the curved surface electrode. The biconvex-shaped focusing electrode is configured to receive a third potential. A ground electrode is configured to receive the ion beam after passing from the biconvex-shaped focusing electrode. The ground electrode is configured to receive a fourth potential.

In another embodiment, there is an electrostatic lens. The electrostatic lens comprises an apertured entrance electrode that receives an ion beam. The apertured entrance electrode is configured to receive a first potential. An electron suppression electrode is configured to receive the ion beam after passing from the apertured entrance electrode. The electron suppression electrode increases the energy and compresses the ion beam passing therethrough when biased with a second potential. The electron suppression electrode comprises a biconvex shape. A ground electrode is configured to receive the ion beam after passing from the electron suppression electrode. The ground electrode is configured to receive a third potential to reduce the energy of the ion beam and change the angles of the ion beam.

In a third embodiment, there is an ion implanter system. The ion implanter system comprises an ion source configured to generate an ion beam. An analyzer magnet is configured to remove unwanted ion species from the ion beam. A mass slit is configured to select specific ion masses transmitted through the analyzer magnet. An electrostatic lens is configured to perform a plurality of ion implanting operations on the ion beam comprising scanning, decelerating, accelerating, compressing, expanding, focusing and parallelizing.

DETAILED DESCRIPTION

Figure 1:
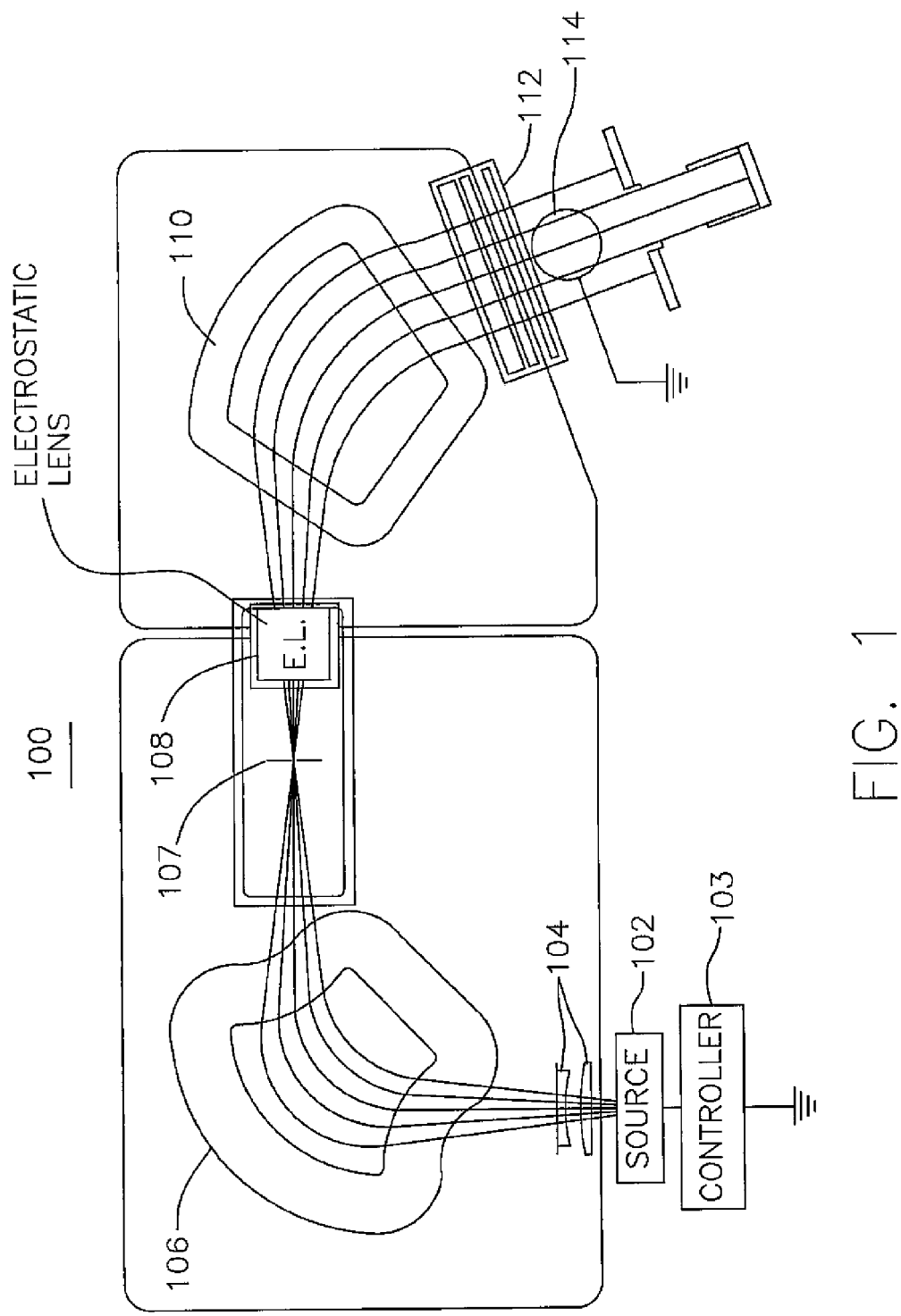
FIG. 1 shows a schematic top view of an ion implanter system according to one embodiment of the disclosure.

FIG. 1 shows a schematic top view of an ion implanter system 100 according to one embodiment of the disclosure. The ion implanter system 100 comprises an ion source 102, such as a plasma source, controlled by a source bias voltage controller 103. The ion source 102 generates a stream of charged particles, known as an ion beam. Extraction electrodes 104 receive the ion beam from the ion source 102 and accelerate the positively charged ions within the beam leaving the source 102. An analyzer magnet 106, such as a 90° deflection magnet, receives the ion beam after positively charged ions have been extracted from the source 102 and accelerates and filters unwanted species from the beam. In particular, as the ion beam enters the analyzer magnet 106, a magnetic field directs the ion species into circular paths. Heavier ions will have larger radii of curvature and strike the outer wall of the analyzer magnet 106; lighter ions have smaller radii of curvature and will strike the inner wall of the magnet. Only ions having the needed mass-to-charge ratio will pass through the analyzer magnet 106. The ion beam passing through the analyzer magnet 106 then enters a mass slit 107 which further removes unwanted ions (ion masses) from the beam.

An electrostatic lens 108 comprising multiple electrodes with defined apertures allow the ion beam to pass therethrough. By applying different combinations of potentials to the multiple electrodes, the electrostatic lens 108 can manipulate ion energies and cause the ion beam to hit a target wafer 114 at a desired energy. This geometry of the electrostatic lens 108 performs a plurality of ion implanting operations on the ion beam comprising scanning, decelerating, accelerating, compressing, expanding, focusing and parallelizing. Below is a more detailed description of the electrostatic lens 108 and its various embodiments.

A corrector magnet 110, such as a 70° degree corrector magnet, collimates the ion beam generated from the electrostatic lens 108 into the correct form for deposition onto the wafer 114. A deceleration stage 112 comprising a deceleration lens receives the ion beam from the corrector magnet 110 and further manipulates the energy of the ion beam before it hits the wafer 114. The ion beam hits the wafer by mechanically moving the wafer through the beam. This allows the ion beam to implant the dopant ions onto the wafer.

For ease of illustration, FIG. 1 shows only components of the ion implanter system 100 that will facilitate a general understanding of the system. Those skilled in the art will recognize that the ion implanter system 100 can have additional components not shown in FIG. 1.

In FIG. 1, the ion implanter system 100 expands the ion beam into a ribbon beam. Although the ion implanter system 100 shown in FIG. 1 is functioning with a ribbon beam, the ion implanter can function with a scanned spot beam or pencil beam. In the ribbon beam mode, the electrostatic lens 108 can accelerate and compress the beam, decelerate and expand the beam, decelerate and compress the beam and accelerate and expand the beam. Other functions that the electrostatic lens 108 can perform on the ribbon beam include focusing and parallelizing. In the spot beam mode, the electrostatic lens scans the beam across the wafer. Below are further details on how the electrostatic lens 108 uses a ribbon beam and spot beam to perform the above functions.

Figure 2:
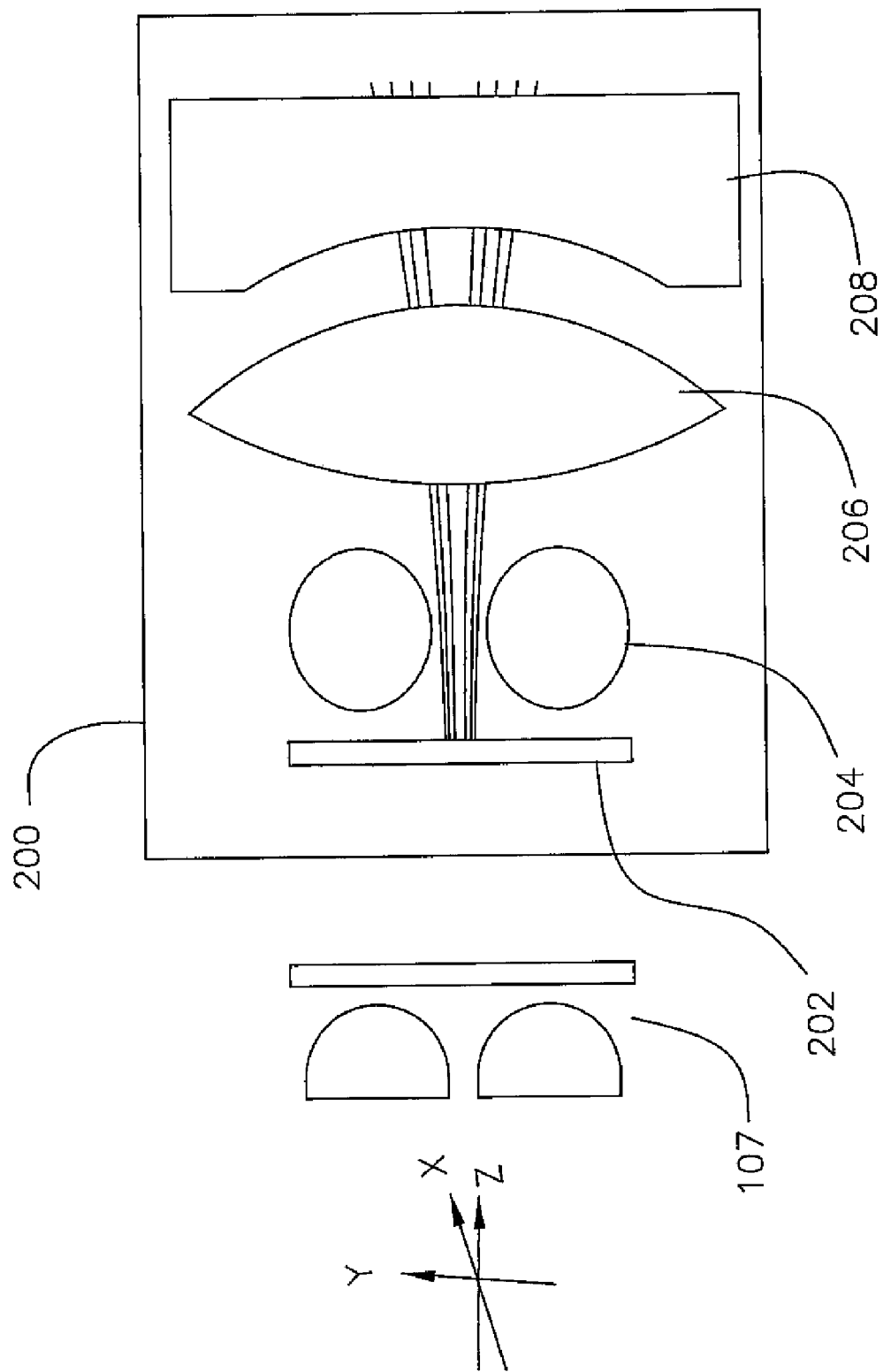
FIG. 2 shows a top view of one embodiment of an electrostatic lens that may operate in the ion implanter system shown in FIG. 1.

FIG. 2 shows a top view of one embodiment of an electrostatic lens 200 that may operate in the ion implanter 100 system shown in FIG. 1. The electrostatic lens 200 comprises an entrance electrode 202 having a defined aperture that permits an ion beam to pass therethrough in the axial direction. The entrance electrode 202, referred to from now on as an apertured entrance electrode, receives an ion beam that has been transmitted through the mass slit 107 and is configured to receive a first potential. In the embodiment shown in FIG. 1, the apertured entrance electrode 202 comprises a planar shape, however, other shapes are possible. For example, the entrance electrode 202 can have a shape that is convex in the direction of the beam propagation.

The electrostatic lens 200 also comprises an electrode 204 having a curved surface that is configured to receive the ion beam after passing through the apertured entrance electrode 202. In one embodiment, as shown in FIG. 2, the curved surface electrode 204 comprises cylindrically-shaped scan plates separated from each other by a predetermined distance. Both of the cylindrically-shaped scan plates can be electrically connected together to share a second potential. When biased one with respect to the other, the cylindrically-shaped scan plates 204 are configured to scan the ion beam.

A biconvex-shaped electrode 206 with a defined aperture receives the ion beam after passing from the cylindrically-shaped scan plates 204. The biconvex shaped electrode 206 is a focusing electrode that receives a third potential with respect to the electrode 204, which enables this electrode to manipulate the energy, shape and angles of the ion beam as it passes through.

A ground electrode 208 with a defined aperture receives the ion beam after passing from the biconvex-shaped focusing electrode 206. The ground electrode 208 comprises a planar-concave-shaped electrode having a concave face that receives the ion beam passing from the biconvex-shaped focusing electrode 206 and a planar face opposite the concave face. The ground electrode 208 receives a fourth potential which enables this electrode together with the biconvex-shaped focusing electrode 206 to produce an electric field to manipulate the energy, shape and angles of the ion beam as it passes through. Although the ground electrode 208 shown in FIG. 2 comprises a planar-concave shape, other shapes are possible. For example, the ground electrode 208 can have a shape that is convex at its output.

As shown in FIG. 2, the apertured entrance electrode 202, cylindrically-shaped scan plates 204, biconvex-shaped focusing electrode 206 and ground electrode 208 have a gap between each other. The dimensions of the gap between each of the electrodes may be fixed or adjustable. In an exemplary embodiment, the dimensions of the gap between each of the electrodes may be about 1 centimeter (cm). One of ordinary skill in the art will recognize that selection of the dimensions of the gap between each of the electrodes defines the electric field strength in the deceleration gap.

Figure 3A:
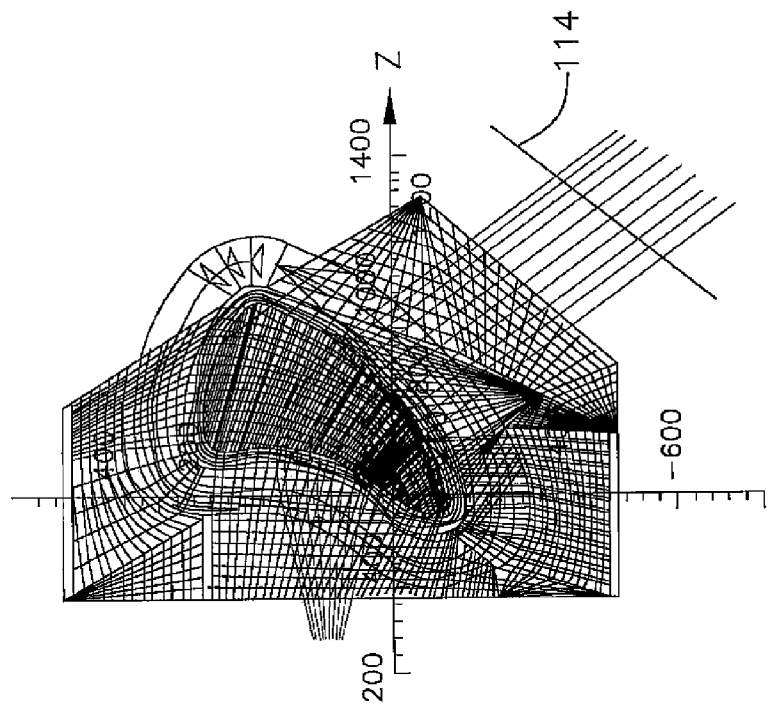
FIGS. 3A-3B show three-dimensional simulations of delivering a spot beam and a ribbon beam, respectively, with the electrostatic lens shown in FIG. 2.

As mentioned above, the electrostatic lens 200 can perform functions on the ion beam that include scanning, accelerating and compressing, decelerating and expanding, decelerating and compressing, accelerating and expanding, focusing and parallelizing. Scanning an ion beam such as a spot beam occurs by applying a voltage potential to one of the cylindrically-shaped scan plates 204 with respect to the other, while the apertured entrance electrode 202, biconvex-shaped focusing electrode 206 and ground electrode 208 remain unbiased. In a typical scanning operation, the cylindrically-shaped scan plates 204 receive a bias voltage of about 20 kilovolt (kV). This creates an electric field that enables the cylindrically-shaped scan plates 204 to shift the ion beam from side to side to produce a uniform beam stripe. After scanning, the beam enters the corrector magnet 110 and is transported to the wafer 114 as illustrated in FIG. 3A.

The electrostatic lens 200 can accelerate and compress the ion beam by applying a potential to the biconvex-shaped focusing electrode 206 relative to the cylindrically-shaped scanning plates 204. In an exemplary operation of the electrostatic lens 200 for the acceleration and compression mode, an ion beam generally enters the apertured entrance electrode 202 with an initial energy of about 60 keV. The ion beam passes through the apertured entrance electrode 202 which is biased at a potential of about −20 keV. The potential applied to the apertured entrance electrode 202 creates an electric field that accelerates the ion beam from the source potential.

Similarly, applying a lower voltage to the biconvex-shaped focusing electrode 206 relative to the cylindrically-shaped scanning plates 204 allows the electrostatic lens to decelerate and expand the ion beam. In an exemplary operation of the electrostatic lens 200 for the deceleration and expansion mode, an ion beam generally enters the apertured entrance electrode 202 with an initial energy of about 60 keV. The ion beam passes through the apertured entrance electrode 202 which is biased with respect to the source potential. The potential applied to the apertured entrance electrode 202 creates an electric field that sets the initial beam energy. The ion beam passes axially from the apertured entrance electrode 202 to the cylindrically-shaped scan plates 204 and biconvex-shaped focusing electrode 206, wherein a potential of about 20 kV is applied to the biconvex-shaped focusing electrode relative to the cylindrically-shaped scan plates. This potential creates an electric field in the gap between the cylindrically-shaped scan plates 204 and the biconvex-shaped focusing electrode 206 that causes the ions in the beam to decelerate to a lower energy.

The electrostatic lens 200 can accelerate and expand the ion beam in the gap between the biconvex-shaped focusing electrode 206 and the ground electrode 208 by applying a potential to the ground electrode relative to the biconvex-shaped focusing electrode. In an exemplary operation of the electrostatic lens 200 for the acceleration and expansion mode, an ion beam generally enters the apertured entrance electrode 202 with an initial energy of about 60 keV. The ion beam passes through the biconvex-shaped focusing electrode 206 to the ground electrode 208, wherein a potential of about −20 kV is applied to the ground electrode. This potential creates an electric field in the gap between the biconvex-shaped focusing electrode 206 and the ground electrode 208 that causes the ions in the beam to accelerate to a higher energy.

In an exemplary operation of the electrostatic lens 200 for the deceleration and compression mode occurring at the gap between the biconvex-shaped focusing electrode 206 and the ground electrode 208, a lower potential is applied to the ground electrode relative to the biconvex-shaped focusing electrode. This potential creates an electric field in the gap between the biconvex-shaped focusing electrode 206 and the ground electrode 208 that causes the ions in the beam to decelerate to a lower energy.

Other operations that the electrostatic lens 108 can perform include focusing the ion beam and parallelizing the ion beam. Since focusing an ion beam is part of the normal lens action a more detailed discussion is not provided. With regard to parallelizing the ion beam, this operation is performed by selecting voltages that are applied to the biconvex-shaped focusing electrode 206. For example, for the ion implanter system 100, a voltage of −10 kV applied to the electrode 206 (FIG. 2) will result in the parallelizing of the ion beam.

The effect that the cylindrically-shaped scan plates 204, biconvex-shaped focusing electrode 206 and ground electrode 208 will have on the manipulation of the energy and shape of the ion beam to perform functions such as scanning, acceleration, deceleration, expansion, compression, focusing and parallelizing is dependent upon the curvature of the electrodes. For instance, the manipulation of the energy, shape and angles of the ion beam for performing deceleration and expansion and acceleration and compression at the gap between the cylindrically-shaped scan plates 204 and the biconvex-shaped focusing electrode 206 will depend on the curvature of these electrodes. In particular, the manipulation of shape and angles is based on a ratio of the radius of the curvature of the curved surface of the cylindrically-shaped scan plates 204 to the radius of the curvature of the face of the biconvex-shaped focusing electrode 206. Performing deceleration and compression and acceleration and expansion, on the other hand, at the gap between the biconvex-shaped focusing electrode 206 and the ground electrode 208 will depend on the curvature of these electrodes. In particular, the manipulation of the energy, shape and angles of the ion beam is based on a ratio of the radius of the curvature of the concave face of the ground electrode 208 to the radius of the curvature of the face of the biconvex-shaped focusing electrode 206. The biconvex-shaped focusing electrode 206 in particular can parallelize the beam to achieve a required shape and angles.

All the above exemplary embodiments are illustrative of only a few conditions that would enable the ion implanter system 100 to perform functions on an ion beam such as scanning, acceleration, deceleration, expansion, compression, focusing and parallelizing and are not limiting. One of ordinary skill in the art will recognize that selection of the biasing voltages for the electrodes, dimensions of the gap between each of the electrodes, as well as the curvature associated with the surfaces of the electrodes will affect the manipulation, shape and angles of the ion beam in performing these functions so different values for these parameters can be selected to obtain varying effects.

The ion implanter system 100 can use all of the above-described operating modes (i.e., scanning, acceleration, deceleration, compression, expansion, parallelizing and focusing) together to provide a powerful method of tuning the ion beam. For example, the beam could be scanned by the cylindrically-shaped electrodes 204, expanded by one set of electrodes, compressed by another set, and either accelerated or decelerated in the same electrostatic lens. Furthermore, the ion implanter system 100 can function in both a spot beam or a ribbon beam mode. For instance, the ion implanter system 100 can perform a bulk of the implant in the ribbon mode with high beam utilization and then use the spot beam mode for fine uniformity control.

Figure 3B:
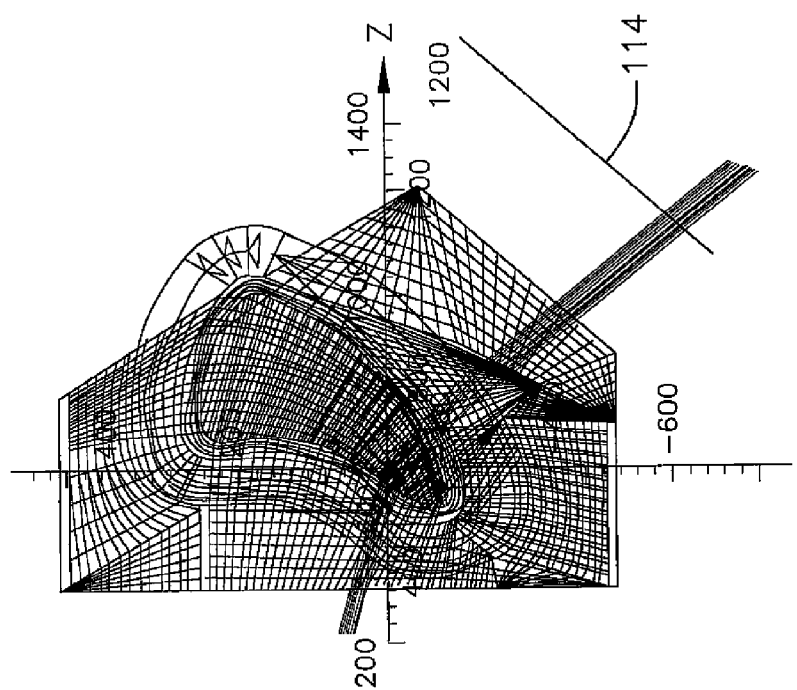

FIGS. 3A-3B show three-dimensional simulations of delivering a spot beam and a ribbon beam, respectively, with the electrostatic lens 200 shown in FIG. 2. In particular, FIG. 3A shows a simulation of how a spot beam generated from the electrostatic lens 200 could be used in conjunction with a corrector magnet 110 (FIG. 1) to deliver the beam to the wafer 114, whereas FIG. 3B shows a simulation of how a ribbon beam generated from the electrostatic lens 200 (FIG. 2) could be used in conjunction with the corrector magnet to deliver the beam to the wafer. Although the simulations were taken in conjunction with a corrector magnet, it is within the scope of this disclosure to have the ion implanter system 100 operate without the corrector magnet 110 because its functionality can be attained by the electrostatic lens 200.

Figure 4:
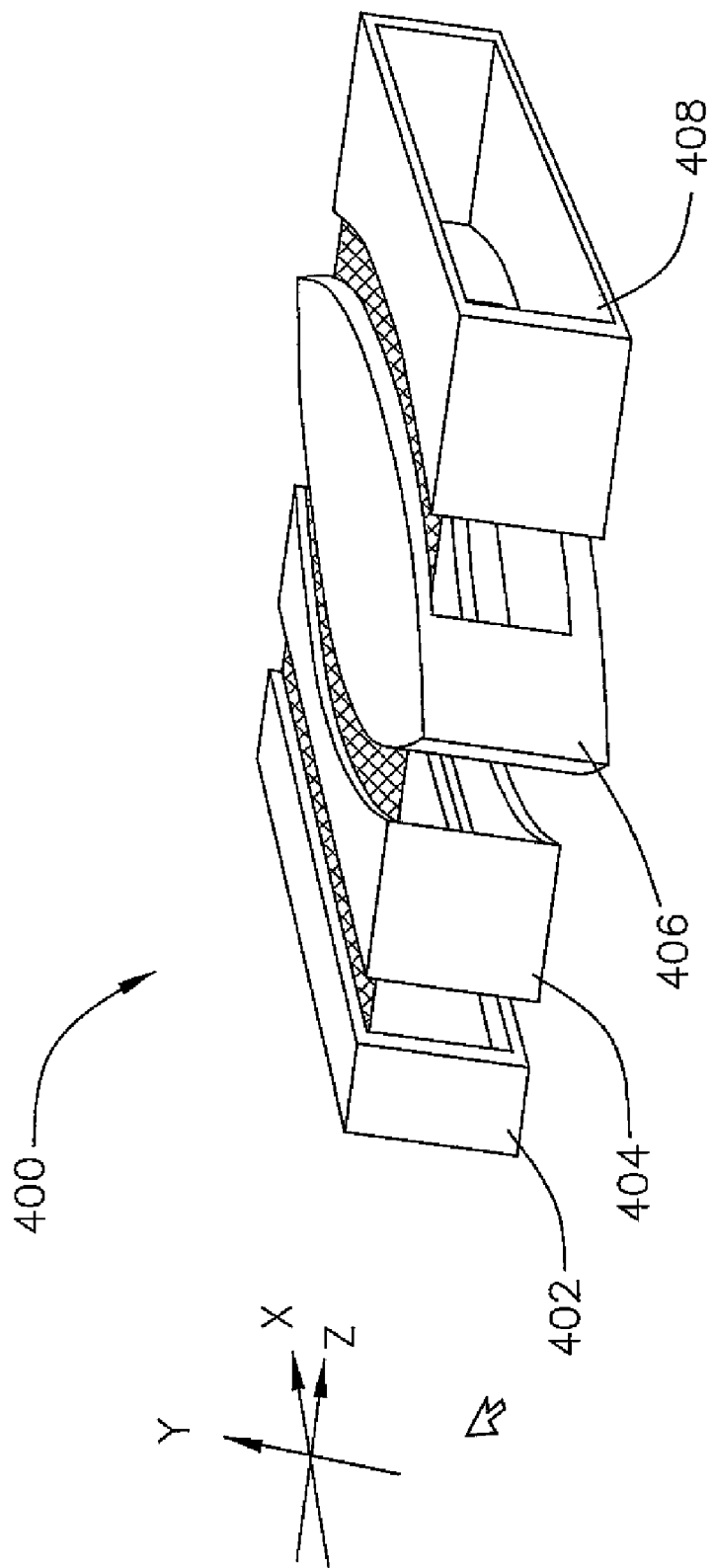
FIG. 4 shows a perspective view of a second embodiment of an electrostatic lens in a tetrode configuration that may operate in the ion implanter system shown in FIG. 1.

FIG. 4 shows a perspective view of a second embodiment of an electrostatic lens that may operate in the ion implanter system 100 shown in FIG. 1. In this embodiment, there is an electrostatic lens 400 comprising four independent driven electrodes generally referred to as a tetrode configuration. The electrostatic lens 400 differs from the lens of FIG. 2 in that the cylindrically-shaped scan plates 204 have been replaced by another curved surface electrode, a planar-concave-shaped electrode 404. In this embodiment, the planar-concave-shaped electrode 404 is an electron suppression electrode that is configured to increase the energy and compress the ion beam passing. The planar face of this electrode 404 is configured so that the angles of individual trajectories stay essentially unchanged. The second face of the electron suppression electrode is curved in a concave manner that induces a negative lens in the horizontal plane. Since the electrostatic lens 400 does not have cylindrically-shaped scan plates, this configuration cannot perform scanning, but can perform the other functions such as acceleration, deceleration, expansion, compression, focusing and parallelizing. As a result, the electrostatic lens 400 is more suitable for use with a ribbon beam as opposed to a spot beam. Generally, in the above arrangement the gap in the beam direction has a length that is less than the height of the smallest rectangular aperture.

The electrostatic lens 400 as shown in FIG. 4 comprises an entrance electrode 402 having a defined aperture that permits an ion beam to pass therethrough in the axial direction. The entrance electrode 402, referred to from now on as an apertured entrance electrode, receives an ion beam that has been transmitted through the mass slit 107 (FIG. 1) and is configured to receive a first potential. In the embodiment shown in FIG. 4, the apertured entrance electrode 402 comprises a planar shape. The electron suppression electrode 404 which has a planar face that receives the ion beam from the apertured entrance electrode 402 and a concave face opposite of the planar face, is configured to receive a second potential that increases the ion beam energy as the beam passes through.

A biconvex-shaped electrode 406 with a defined aperture receives the ion beam after passing from the planar-concave-shaped electrode 404. The biconvex shaped electrode 406 is a focusing electrode that receives a third potential which enables the electrode to manipulate the energy, shape and angles of the ion beam as it passes through. The radii of curvatures between these elements is chosen to further compensate for the angular deflection introduced by the final deceleration between electrode 406 and the ground electrode 408 that receives the ion beam after passing from the biconvex-shaped focusing electrode 406. The ground electrode 408 comprises a planar-concave-shaped electrode having a concave face that receives the ion beam passing from the biconvex-shaped electrode 406 and a planar face opposite the concave face. The ground electrode 408 receives a fourth potential which enables the electrode to manipulate the energy and shape of the ion beam passing therethrough.

The apertured entrance electrode 402, planar-concave-shaped electrode 404, biconvex-shaped focusing electrode 406 and ground electrode 408 have a gap between each other so that an ion beam can pass therethrough (e.g., in the +z direction along the beam direction). The dimensions of the gap between each of the electrodes may be fixed or adjustable. In an exemplary embodiment, the dimensions of the gap between each of the electrodes may be about 1 cm. One of ordinary skill in the art will recognize that selection of the dimensions of the gap between each of the electrodes can vary.

As mentioned above, the electrostatic lens 400 can perform functions that include accelerating and compressing, decelerating and expanding, decelerating and compressing, accelerating and expanding, focusing and parallelizing an ion beam. These operations are performed in a manner similar to the ones described with reference to FIG. 2 and thus a separate description is not provided. One of ordinary skill in the art will recognize that selection of the biasing voltages for the electrodes, dimensions of the gap between each of the electrodes, as well as the curvature associated with the surfaces of the electrodes will affect the manipulation and shape of the ion beam in performing acceleration, deceleration, expansion, compression, focusing and parallelizing, so different values for these parameters can be selected to obtain varying effects for the tetrode configuration lens.

Figure 5:
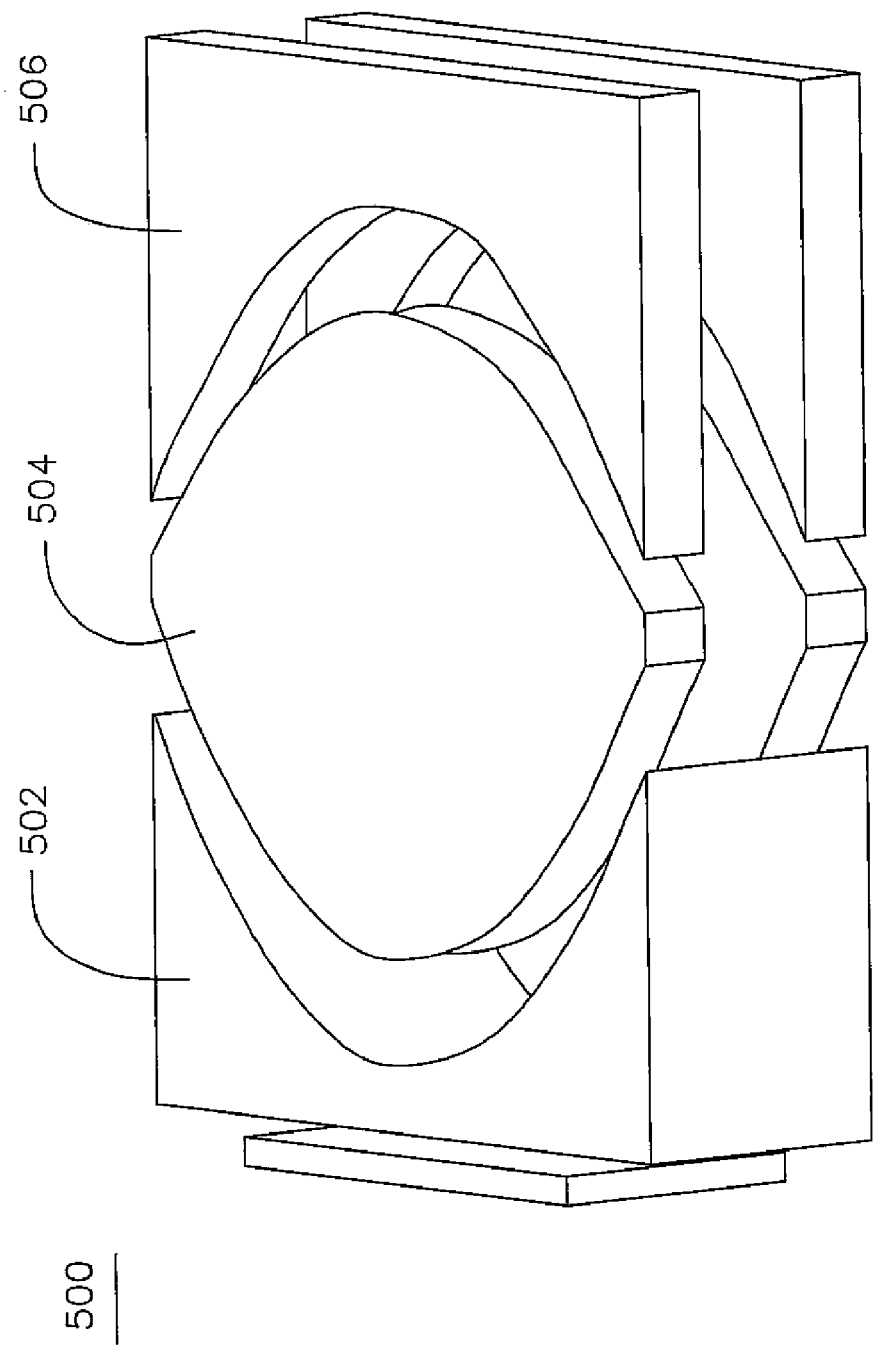
FIG. 5 shows a perspective view of another embodiment of an electrostatic lens in a triode configuration that may operate in the ion implanter system shown in FIG. 1.

FIG. 5 shows a perspective view of another embodiment of an electrostatic lens that may operate in the ion implanter system 100 shown in FIG. 1. In this embodiment, there is an electrostatic lens 500 comprising three independent driven electrodes generally referred to as a triode configuration. The electrostatic lens 500 comprises an apertured entrance electrode 502, an electron suppression electrode 504 having a biconvex shape and a ground electrode 506. The apertured entrance electrode 502 is configured to receive a first potential. The biconvex-shaped electron suppression electrode 504 is configured to receive the ion beam after passing from the apertured entrance electrode 502. When biased with a second potential, the electron suppression electrode 504 accelerates selected ions and compresses the ion beam passing therethrough. The ground electrode 506 is configured to receive the ion beam after passing from the suppression electrode. In addition, the ground electrode 506 is configured to receive a third potential which enables it to reduce the energy of the ion beam and change the angles of the beam. With this configuration, the electrostatic lens 500 can perform operations such as acceleration, deceleration, expansion, compression, focusing and parallelizing in the manner described above. One of ordinary skill in the art will recognize that selection of the biasing voltages for the electrodes, dimensions of the gap between each of the electrodes, as well as the curvature associated with the surfaces of the electrodes will affect the manipulation of the energy, shape and angles of the ion beam in performing acceleration, deceleration, expansion, compression, focusing and parallelizing, so different values for these parameters can be selected to obtain varying effects for the triode configuration lens.

It is apparent that there has been provided with this disclosure a multi-purpose electrostatic lens for an ion implanter system. While the disclosure has been particularly shown and described in conjunction with a preferred embodiment thereof, it will be appreciated that variations and modifications can be effected by a person of ordinary skill in the art without departing from the scope of the disclosure.

What is claimed is:

1. An electrostatic lens, comprising:
    an apertured entrance electrode that receives an ion beam, wherein the apertured entrance electrode is configured to receive a first potential;
    an electrode having a curved surface that is configured to receive the ion beam after passing through the apertured entrance electrode, wherein the curved surface electrode is configured to receive a second potential;
    a biconvex-shaped focusing electrode configured to receive the ion beam after passing from the curved surface electrode, wherein the biconvex shaped focusing electrode is configured to receive a third potential; and
    a ground electrode configured to receive the ion beam after passing from the biconvex-shaped focusing electrode, wherein the ground electrode is configured to receive a fourth potential.

2. The electrostatic lens of claim 1, wherein the apertured entrance electrode comprises a planar shape.

3. The electrostatic lens of claim 1, wherein the curved surface electrode comprises cylindrically-shaped scan plates.

4. The electrostatic lens of claim 3, wherein the cylindrically-shaped scan plates are configured to scan the ion beam when biased with the second potential.

5. The electrostatic lens of claim 1, wherein the curved surface electrode and the biconvex-shaped focusing electrode are configured to decelerate and expand the ion beam when biased with the third potential relative to the second potential.

6. The electrostatic lens of claim 1, wherein the curved surface electrode and the biconvex-shaped focusing electrode are configured to accelerate and compress the ion beam when biased with the third potential relative to the second potential.

7. The electrostatic lens of claim 1, wherein the biconvex-shaped focusing electrode modifies energy, shape and angles of the ion beam passing therethrough.

8. The electrostatic lens of claim 7, wherein the manipulation of the energy, shape and angles of the ion beam is dependent upon the curvature of the curved surface electrode and the curvature of a face of the biconvex-shaped focusing electrode.

9. The electrostatic lens of claim 8, wherein the manipulation of energy, shape and angles of the ion beam is based on a ratio of the radius of the curvature of the curved surface electrode to the radius of the curvature of the face of the biconvex-shaped focusing electrode.

10. The electrostatic lens of claim 1, wherein the ground electrode comprises a planar-concave shaped electrode having a planar face at one side and a concave face opposite therefrom, wherein the concave face receives the ion beam after passing through the biconvex-shaped focusing electrode.

11. The electrostatic lens of claim 10, wherein manipulation of energy, shape and angles of the ion beam performed by the biconvex-shaped focusing electrode and the ground electrode is dependent upon the curvature of the concave face of the planar-concave-shaped electrode and the curvature of a face of the biconvex-shaped focusing electrode opposite therefrom.

12. The electrostatic lens of claim 11, wherein the manipulation of energy, shape and angles of the ion beam is based on a ratio of the radius of the curvature of the concave face of the planar-concave-shaped electrode to the radius of the curvature of the face of the biconvex-shaped focusing electrode.

13. The electrostatic lens of claim 1, wherein the biconvex-shaped focusing electrode and the ground electrode are configured to decelerate and compress the ion beam when biased with the fourth potential relative to the third potential.

14. The electrostatic lens of claim 1, wherein the biconvex-shaped focusing electrode and the ground electrode are configured to accelerate and expand the ion beam when biased with the fourth potential relative to the third potential.

15. The electrostatic lens of claim 1, wherein the curved surface electrode comprises a planar-concave-shaped electrode having a planar face at one side and a concave face opposite therefrom, wherein the planar face receives the ion beam after passing through the apertured entrance electrode.

16. The electrostatic lens of claim 15, wherein the planar-concave-shaped electrode is an electron suppression electrode that increases the energy of the ion beam passing therethrough when biased with the second potential.

17. The electrostatic lens of claim 16, wherein manipulation of energy, shape and angles of the ion beam performed by the electron suppression electrode and the biconvex-shaped focusing electrode is dependent upon the curvature of the concave face of the planar-concave-shaped electrode and the curvature of a face of the biconvex-shaped focusing electrode opposite therefrom.

18. The electrostatic lens of claim 15, wherein the planar-concave-shaped electrode and the biconvex-shaped focusing electrode are configured to decelerate and expand the ion beam when biased with the third potential with respect to the second potential.

19. The electrostatic lens of claim 15, wherein the planar-concave-shaped electrode and the biconvex-shaped focusing electrode are configured to accelerate and compress the ion beam when biased with the third potential with respect to the second potential.

20. The electrostatic lens of claim 1, wherein the ion beam comprises a spot beam or a ribbon beam.

21. An electrostatic lens, comprising:
an apertured entrance electrode electron that receives an ion beam, wherein the apertured entrance electrode is configured to receive a first potential;
an electron suppression electrode configured to receive the ion beam after passing from the apertured entrance electrode, wherein the electron suppression electrode increases energy of the ion beam and compresses ion beam passing therethrough when biased with a second potential, wherein the electron suppression electrode comprises a biconvex shape; and
a ground electrode configured to receive the ion beam after passing from the electron suppression electrode, wherein the ground electrode is configured to receive a third potential for reducing the energy of the ion beam and changing the angles of the ion beam.

22. The electrostatic lens of claim 21, wherein the apertured entrance electrode comprises a planar-concave-shaped electrode having a planar face at one side to receive the ion beam and a concave face opposite therefrom, wherein the concave face is opposite from a face of the biconvex-shaped suppression electrode.

23. The electrostatic lens of claim 22, wherein manipulation of energy and shape the ion beam performed by the apertured entrance electrode and the biconvex-shaped suppression electrode is dependent upon the curvature of the concave face of the planar-concave-shaped apertured entrance electrode and the curvature of a face of the biconvex-shaped suppression electrode opposite therefrom.

24. The electrostatic lens of claim 23, wherein the manipulation of energy, shape and angles of the ion beam is based on a ratio of the radius of the curvature of the concave face of the planar-concave-shaped apertured entrance electrode to the radius of the curvature of the face of the biconvex-shaped suppression electrode.

25. The electrostatic lens of claim 21, wherein the apertured entrance electrode and the biconvex-shaped suppression electrode are configured to decelerate and expand the ion beam when biased with the second potential relative to the first potential.

26. The electrostatic lens of claim 21, wherein the apertured entrance electrode and the biconvex-shaped suppression electrode are configured to accelerate and compress the ion beam when biased with the second potential relative to the first potential.

27. The electrostatic lens of claim 21, wherein the ground electrode comprises a planar-concave-shaped electrode having a planar face at one side and a concave face opposite therefrom, wherein the concave face receives the ion beam after passing through the biconvex-shaped suppression electrode.

28. The electrostatic lens of claim 27, wherein manipulation of energy, shape and angles of the ion beam is dependent upon the curvature of the concave face of the planar-concave-shaped ground electrode and the curvature of a face of the biconvex-shaped suppression electrode opposite therefrom.

29. The electrostatic lens of claim 28, wherein the manipulation of energy and shape of the ion beam is based on a ratio of the radius of the curvature of the concave face of the planar-concave shaped ground electrode to the radius of the curvature of the face of the biconvex-shaped suppression electrode.

30. The electrostatic lens of claim 21, wherein the biconvex-shaped suppression electrode and the ground electrode are configured to decelerate and compress the ion beam when biased with the third potential relative to the second potential.

31. The electrostatic lens of claim 21, wherein the biconvex-shaped suppression electrode and the ground electrode are configured to accelerate and expand the ion beam when biased with the third potential relative to the second potential.

32. The electrostatic lens of claim 21, wherein the ion beam comprises a spot beam or a ribbon beam.

* * * * *